United States Patent [19]
Bandyopadhyay et al.

[11] Patent Number: 6,165,906
[45] Date of Patent: Dec. 26, 2000

[54] SEMICONDUCTOR TOPOGRAPHY EMPLOYING A SHALLOW TRENCH ISOLATION STRUCTURE WITH AN IMPROVED TRENCH EDGE

[75] Inventors: Basab Bandyopadhyay; Douglas J. Bonser; Michael J. McBride, all of Austin, Tex.

[73] Assignee: Advanced Micro Devices, Inc., Sunnyvale, Calif.

[21] Appl. No.: 09/237,412

[22] Filed: Jan. 26, 1999

[51] Int. Cl.$^7$ .................................................. H01L 21/311
[52] U.S. Cl. ........................... 438/700; 438/248; 438/424; 438/431
[58] Field of Search ............................ 438/689, 690–694, 438/700, 701, 704, 706, 248, 221, 431, 424, 410

[56] References Cited

U.S. PATENT DOCUMENTS

| | | |
|---|---|---|
| 5,741,738 | 4/1998 | Mandelman et al. ................... 438/296 |
| 5,753,561 | 5/1998 | Lee et al. .................................. 438/424 |
| 5,801,083 | 9/1998 | Yu et al. ................................... 438/424 |
| 5,989,977 | 11/1999 | Wu ........................................... 438/431 |
| 6,001,704 | 12/1999 | Cheng et al. ............................ 438/410 |
| 6,008,079 | 12/1999 | Wu ........................................... 438/175 |

*Primary Examiner*—Benjamin L. Utech
*Assistant Examiner*—Kin-Chan Chen
*Attorney, Agent, or Firm*—Conley, Rose & Tayon, PC; Kevin L. Daffer

[57] ABSTRACT

A method of forming an improved isolation trench between active regions within the semiconductor substrate involves oxidizing unmasked portions of a semiconductor substrate prior to etching an isolation trench into the semiconductor substrate. By oxidizing the unmasked portions of the semiconductor prior to etching, an isolation trench with rounded corners may be formed.

20 Claims, 3 Drawing Sheets

SEMICONDUCTOR TOPOGRAPHY EMPLOYING A SHALLOW TRENCH ISOLATION STRUCTURE WITH AN IMPROVED TRENCH EDGE

BACKGROUND OF THE INVENTION

1. Field of the Invention

This invention relates to semiconductor fabrication and more particularly to an improved shallow trench isolation structure having rounded trench upper corners.

2. Description of the Relevant Art

The fabrication of an integrated circuit involves forming numerous devices in active areas of a semiconductor substrate. Select devices are interconnected by conductors which extend over a dielectric that separates or "isolates" those devices. Implementing an electrical path across a monolithic integrated circuit involves selectively connecting devices which are isolated from each other. When fabricating integrated circuits, it is therefore necessary to isolate devices built into the substrate from one another. From this perspective, isolation technology is one of the critical aspects of fabricating a functional integrated circuit.

A popular isolation technology used for a MOS integrated circuit is a technique known as the "shallow trench process". Conventional trench processes involve the steps of etching a silicon-based substrate surface to a relatively shallow depth (e.g., between 0.2 to 0.5 microns) and then refilling the shallow trench with a deposited dielectric. The trench dielectric is then planarized to complete formation of a trench isolation structure in field regions of the substrate. The trench isolation structure is formed during the initial stages of integrated circuit fabrication, before source and drain implants are placed in device areas or active areas. Trench isolation processing serves to prevent the establishment of parasitic channels in the field regions between active areas. The trench process is becoming more popular than the local oxidation of silicon process ("LOCOS"), another well known isolation technique. The shallow trench process eliminates many of the problems associated with LOCOS, such as bird's-beak and channel-stop dopant redistribution problems. In addition, the trench isolation structure is fully recessed, offering at least a potential for a planar surface. Yet further, field-oxide thinning in narrow isolation spaces is less likely to occur when using the shallow trench process.

FIG. 1 is a cross-sectional view of a conventional STI structure disposed within a silicon substrate 102. Generally, once a trench is etched into substrate 102, a dielectric such as silicon dioxide ($SiO_2$) or "oxide" 104 is deposited into the trench until it is completely filled. After the oxide has been deposited, a chemical mechanical polishing operation (CMP) may be performed in order to remove any excess oxide 104 from the surface of substrate 102 outside the trench area. As shown, the resulting trench has very sharp upper corners 106 near the surface of substrate 102. Sharp corners are those defined by a sidewall surface (or perimeter) of the trench near the upper surface of the trench being substantially perpendicular to the substrate surface. These sharp upper corners 106 are typically a result of the methodology by which the trench is formed—i.e., etched. A popular trench etchant is directional, whereby fine-line demarcation is a desired outcome brought about by, e.g., a plasma etch. This assumes the sidewalls of the trench are virtually vertical, and perpendicular to the substrate surface. The fill material merely maintains those sharp corners and is intended not to modify the position and/or angle at or near the trench upper corners.

Sharp upper corners 106 may introduce certain undesirable effects during subsequent processing steps which may have an impact on an integrated circuit's operation. One problem that results from sharp upper corners 106 is "structural stresses" in the silicon structure of substrate 102 when subsequent layers are deposited over and into a previously defined trench. The structural stresses are caused by stress mismatches between the substrate bulk material (single crystal lattice) near the edge of the active area and the overlying dielectric or conductive layers placed proximate to the active area edge or periphery. Any stress within the lattice may cause a number of dislocations in the silicon crystal near and around upper corners 106. These dislocations usually migrate deeper into lower portions of the substrate during subsequent thermal processing steps (e.g., annealing). As these dislocations migrate away from upper corners 106, the dislocations may form convenient paths for leakage currents. As a result, dislocations 106 may provide an electrical conduction bridge that allows currents flowing through one device to "leak" into the substrate.

In further processing, a dielectric layer 110 is typically deposited over the planarized surface. As shown, a conductive pattern 108 may be deposited and patterned over dielectric layer 110. Conductive pattern 108 is usually a polysilicon line, doped in situ or after patterning, acting as a transistor gate. Sharp corners 106 tend to congregate the electric fields in dielectric layer 110 which causes bunching of electric fields in the corner area. As a result of this bunching of the electric field, the corner has a lower breakdown voltage for the gate oxide. As a consequence, gate oxide reliability will suffer, i.e., the gate may short with the channel area before the devices projected life span has been reached (typically 10 years).

It would therefore be desirable to develop a technique for forming a trench isolation structure which would reduce substrate dislocations, and more evenly disperse electric fields among the active area and particularly at the active area edges.

SUMMARY OF THE INVENTION

The problems outlined above are in large part addressed by an improved shallow trench isolation process. The shallow trench isolation process hereof relates to a shallow trench isolation process that includes selective oxidation of the semiconductor substrate prior to etching the isolation trench into the semiconductor substrate. After forming a patterned masking layer, which includes a window extending through the masking layer, over the semiconductor substrate, the semiconductor substrate is subjected to thermal oxidation conditions. The upper surface of a region of the silicon substrate, defined by the window, is preferably oxidized at a much faster rate than regions of the semiconductor substrate covered by the masking layer. The patterned masking layer (or layers) used to define the oxidation opening can further be used to etch a trench within the underlying substrate. Subsequent formation of the isolation trench followed by removal of the masking layers, will produce an isolation trench where the semiconductor substrate is substantially rounded at the transition regions between the shallow trench and the unetched region of the semiconductor substrate. Rounding of these transition regions may improve the isolation properties of the isolation trench. It is believed that an isolation trench with rounded transition regions may reduce substrate dislocations, intense electric fields at underlying sharp edges, and leakage currents between neighboring semiconductor devices.

In one embodiment, a method is provided for forming an improved isolation trench. A masking layer is formed on a silicon substrate. The masking layer may include any material having a dissimilar etch rate to the semiconductor substrate. Preferably, the masking layer includes silicon nitride or "nitride" preferably formed upon a pad oxide. A photoresist layer is patterned onto the masking layer with a conventional photolithography process Exposed regions of the masking layer are then removed with a wet or dry etch process to form a window extending vertically through the masking layer.

After patterning of the masking layer, the semiconductor substrate is subjected to thermal oxidation. Thermal oxidation preferably causes the unmasked portions of the semiconductor substrate to become oxidized at a faster rate than the masked portions of the semiconductor substrate. In fact, if nitride is used as the hard mask material, the substrate surface beneath the nitride will experience little if any thermal oxidation. This differential oxidation produces an oxide layer upon the upper surface of the semiconductor substrate that has a variable width, the width being greatest where the window is present in the masking layer. This uneven growth causes the formation of curved transition regions (i.e., the regions at the boundaries of the window). The degree of rounding at these transition regions is preferably controlled by the oxidation process conditions. By varying the thickness of the oxide at these transition regions, the degree of rounding may be variably enhanced.

After oxidation of the semiconductor substrate, isolation trenches are then etched into the semiconductor substrate. This etching produces an isolation trench where the semiconductor substrate is substantially curved in the upper corners of the isolation trench. After the trench is formed, the sidewalls and bottom of the trench are cleaned and a thermally grown dielectric liner layer is produced on the inner surface of the isolation trench. Formation of a thermally grown oxide on the sidewalls of the trench may remove damage to the semiconductor substrate caused during the etching step. While oxidation of the semiconductor substrate after formation of the isolation trench may also cause rounding of the semiconductor substrate in the upper corners, it is preferred that the upper corner regions are oxidized prior to etching the semiconductor substrate in order to variably control the amount of rounding and to avoid having to depend on thermally grown oxide thickness within the trench to quantify the rounding. Thus, the rounding effect is achieved primarily by controlling the thermal cycle prior to etching the trench and not necessarily after the trench is already defined. Furthermore, the mask used to present an opening to the to-be-formed trench (and form the trench) will also be used to receive an oxygen-bearing source material used in producing the oxide. Typically, a post etch oxidation of the isolation trench is used to repair some of the damage caused by the etching process. However, it is not desirable to grow a thick oxide layer within the trench since it may cause excessive oxidation of the bottom corners of the trench. It is preferred that a relatively thin layer (e.g., from about 50 to about 100 mn) of oxide is grown for this purpose. Use of a thicker grown oxide is not as desirable, since excessive oxidation of the inner surface of the trench will unduly reduce the size of the active regions of the transistor and, more specifically, the gate width of the ensuring transistor. The formation of a post-etch thin oxide on the interior surfaces of the isolation trench, however, may not necessarily produce corners that are sufficiently rounded to prevent structure stress and voltage breakdown. The described procedure allows the degree of rounding at the upper corners of the isolation trench to be controlled independently of the thermal oxidation of the interior of the isolation trench. By independently controlling these process, the corners may be rounded with minimal reduction in the size of the active regions.

After formation of the dielectric liner layer, the trench is then filled with a fill dielectric and planarized so that an upper surface of the dielectric is substantially coplanar with an upper surface of the masking layer. The masking layer and the underlying oxide layer may be removed, and the fill dielectric is planarized to form an isolation trench which has an upper surface commensurate with the upper surface of the semiconductor substrate.

BRIEF DESCRIPTION OF THE DRAWINGS

Other objects and advantages of the invention will become apparent upon reading the following detailed description and upon reference to the accompanying drawings in which.

Figure 1:
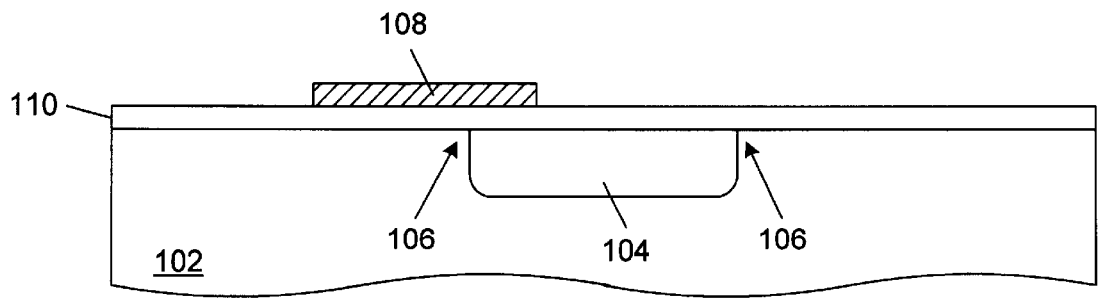
FIG. 1 is a cross-sectional view of a conventional STI structure disposed within a silicon substrate.

While the invention is susceptible to various modifications and alternative forms, specific embodiments thereof are shown by way of example in the drawing and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Figure 2:
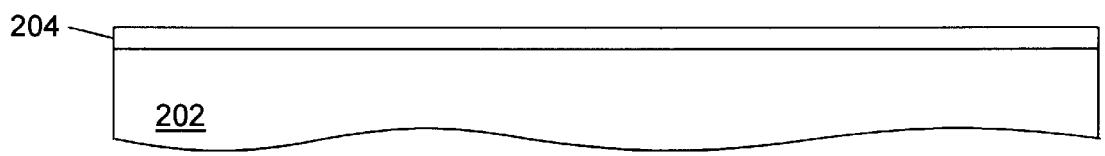
FIG. 2 is partial cross-sectional view of a semiconductor substrate upon which a pad oxide layer is formed.
Figure 3:
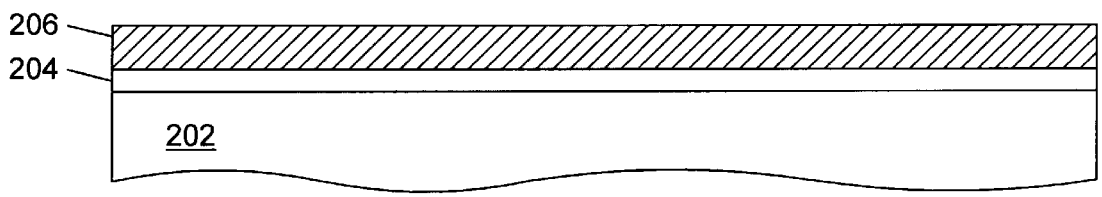
FIG. 3 is a processing step subsequent to FIG. 2, in which a masking layer is formed on the pad layer.

Turning now to the drawings, FIGS. 2–8 illustrate a process sequence for forming an isolation structure between adjacent active regions within a semiconductor substrate. FIG. 2 depicts a semiconductor substrate 202 across which a thin layer of thermally grown oxide 204 is preferably disposed. The oxide layer 204 may, alternatively, be CVD deposited upon a semiconductor substrate 202. Semiconductor substrate 202 is preferably single crystalline silicon. As shown in FIG. 3 a masking layer 206, preferably silicon nitride ($Si_3N_4$), may be deposited across oxide layer 204. The oxide deposition and the nitride deposition may be performed using, e.g., a horizontal tube low pressure chemical vapor deposition reactor ("LPCVD reactor"). When a nitride/oxide stack, as depicted in FIG. 3 is used, the oxide layer 204 serves as a "pad oxide" to reduce inherent stresses that exist between CVD nitride on a silicon substrate.

Figure 4:
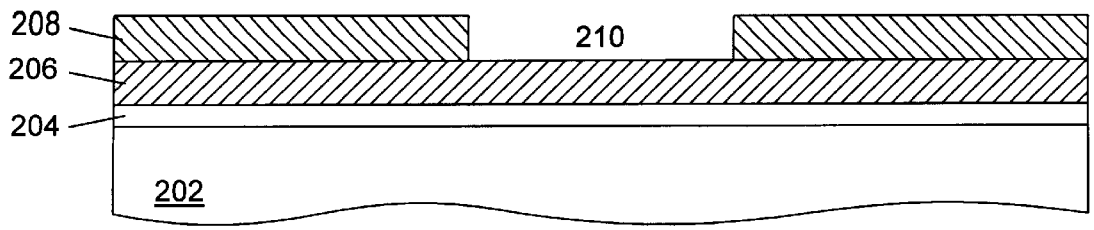
FIG. 4 is a processing step subsequent to FIG. 3, in which a photoresist layer is patterned on the masking layer.

As shown in FIG. 4, a patterned photoresist layer 208 is formed on masking layer 206. Patterning of photoresist layer 208 is accomplished with a photolithographic step as is well known in the semiconductor processing field. Photoresist layer 208 is patterned such that window 210 is opened in photoresist layer 208 exposing a portion of the underlying masking layer 206. The exposed portion is henceforth defined as the isolation area and the covered portion is the active area.

Figure 5:
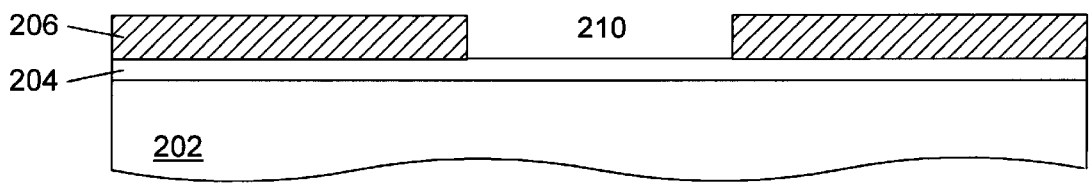
FIG. 5 is a processing step subsequent to FIG. 4, in which the masking layer is patterned and the photoresist layer is removed.

FIG. 5 shows a subsequent processing step in which masking layer 206 is etched using patterned photoresist layer 208 as a mask. The pattern of the photoresist layer is transferred to masking layer 206 such that window 210 is formed in the masking layer. The photoresist layer is removed and patterned masking layer 206 is used as a mask for subsequent processing steps. It is important that the photoresist layer be removed and that only patterned layer 206 be used as the subsequent mask since thermal cycles will be employed against which a photoresist layer is incapable of withstanding the temperatures of such thermal cycles.

Figure 6:
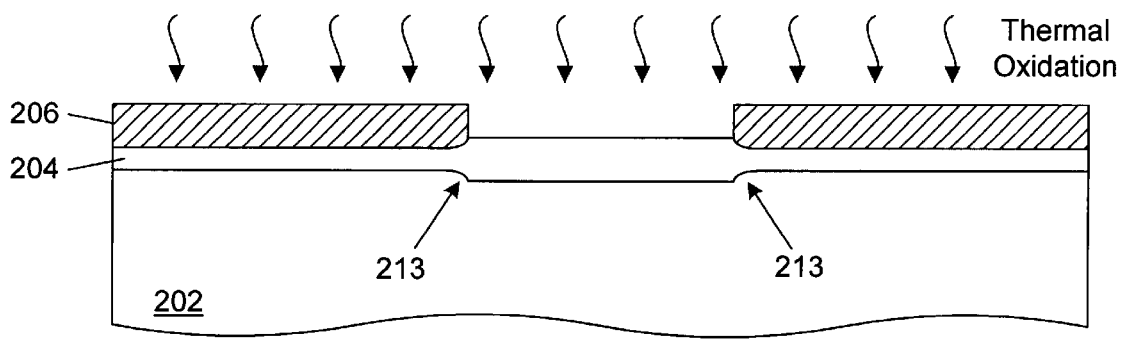
FIG. 6 is a processing step subsequent to FIG. 5, in which the semiconductor substrate is oxidized.

Prior to further processing, the semiconductor substrate is oxidized. FIG. 6 depicts the thermal oxidation of the semiconductor substrate 202. The oxidation is preferably performed in a thermal oxidation furnace using temperatures of approximately 900° C. for a relatively short time (e.g., less than 60 minutes), in an oxygen bearing atmosphere. The portions of the semiconductor substrate 202 that are underneath window 210 are preferably oxidized at a much faster rate than the masked portions of the semiconductor substrate. This differential oxidation produces an oxide layer 204 that has a variable width, the width being greatest where window 210 is present in the masking layer. This uneven growth causes the transition regions 213 (i.e., the regions at the boundaries of window 210) to become curved. The curved angle of entry extends from the upper planar surface to a sidewall of the existing trench. The degree of curvature at the transition regions is preferably controlled by the oxidation process conditions and/or the susceptibility of the masking material. By varying the thickness of the oxide at these transition regions, the degree of rounding may be controlled. Also, if nitride is used as the masking material, nitride is far less susceptible to oxygen penetration than other types of masking material such as polymers or other forms of material sourced from, for example, silane, etc. A more rounded corner may be achieved by increasing the length of time for the oxidation process or employing a mask that will allow more oxygen penetration. Alternatively, a less rounded corner may be produced by decreasing the length of time of the oxidation process, etc.

Figure 7:
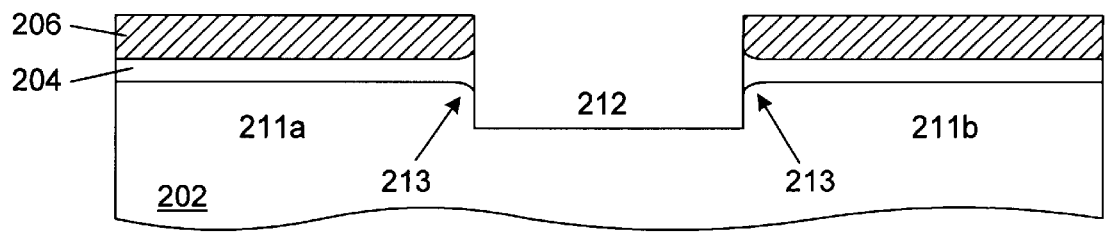
FIG. 7 is a processing step subsequent to FIG. 6, in which a trench is formed in the semiconductor substrate through the nitride layer and the oxidized layer.

FIG. 7 depicts a processing step in which trench 212 has been etched into semiconductor substrate 202 between first active region 211a and second active region 211b. Trench 212 is preferably formed with an anisotropic plasma etch process designed to etch oxide layer 204 and semiconductor substrate 202 in lieu of masking layer 206 in the regions corresponding to window 210. Anisotropic etching of silicon nitride, silicon dioxide, and silicon are generally well known. Anisotropic etching of semiconductor substrates typically produces sharp upper corners in the formed trenches (See FIG. 1, upper corners 106). By oxidizing the trench prior to etching the semiconductor substrate the semiconductor substrate is preferably rounded at the transition region 213 between the shallow trench and the unetched regions of the semiconductor substrate.

Figure 8:
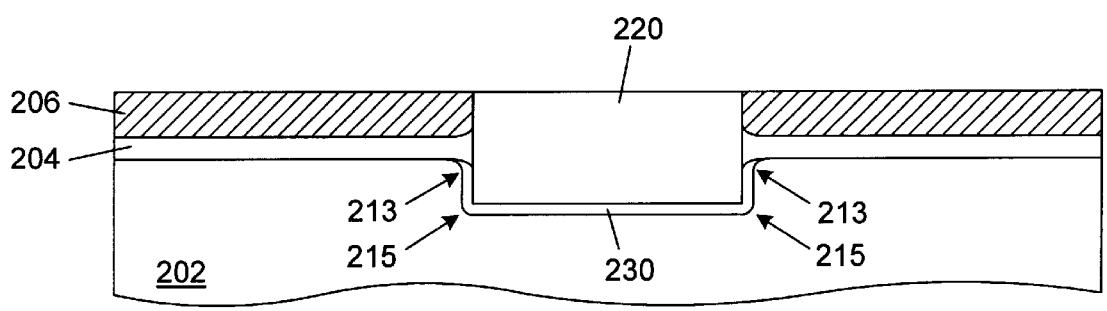
FIG. 8 is a processing step subsequent to FIG. 7, in which a dielectric fill layer is deposited to fill the trench.

In the embodiment shown in FIG. 8, oxide is grown to form a dielectric liner layer 230. Dielectric layer 230 is preferably a thin oxide layer. Prior to oxide growth the interior surface of the trench may be washed with a combination of a wet HF solution etch and a dry $O_2$ etch. This cleaning prior to oxidation may help to reduce the leakage current of bipolar transistors isolated by the trenches. After cleaning, a thin oxide layer (e.g., up to about 50 nm thick) is thermally grown on the bottom and sidewalls of the isolation trench. Formation of a thermally grown oxide on the sidewalls of the trench may remove damage to the semiconductor substrate caused during the etching step. Oxidation of the sidewalls may also cause further rounding of the upper corners 213, as well as bottom corners 215 of the isolation trench. Rounding of these areas may produce an isolation trench which exhibits much lower leakage current than an isolation trench formed with sharp corner areas.

After formation of dielectric liner layer 230, a dielectric fill layer 220 is deposited over the substrate. In the presently preferred embodiment, dielectric fill layer 220 comprises CVD oxide formed from a TEOS source. After dielectric fill layer 220 is deposited, the dielectric fill layer is planarized such that the upper surface of the dielectric fill layer is commensurate with the upper surface of the masking layer. Planarization of dielectric fill layer 220 may be accomplished with a chemical mechanical polish or a selective etch back.

Figure 9:
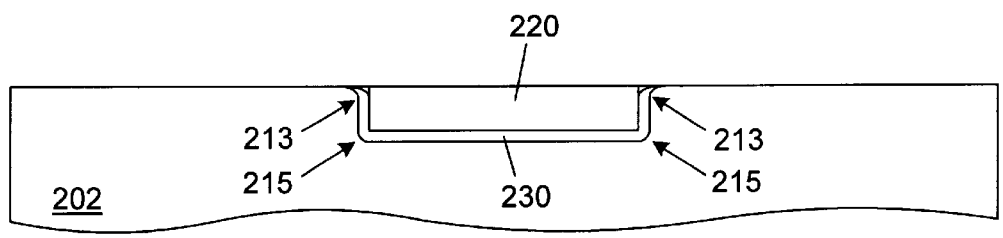
FIG. 9 is a processing step subsequent to FIG. 8, in which the masking and oxide layers are removed from the semiconductor substrate, and the dielectric fill layer further planarized.

FIG. 9 depicts a subsequent processing step in which the masking layer is removed and the dielectric fill layer extending exterior to the trench is removed. The removal of masking layer 206 may be accomplished by a dry or wet etch process. The removal of masking layer 206 is preferably accomplished with a heated solution of phosphoric acid, when the masking layer is composed of nitride. Oxide layer 204 may also be removed by a dry or wet etch process. Subsequently, a portion of the dielectric fill layer 220 is preferably removed such that an upper surface of the dielectric fill layer is commensurate with either the upper surface of oxide layer 204 or, if the oxide layer has been removed, the upper surface of the semiconductor substrate 202.

It will be appreciated to those skilled in the art having the benefit of this disclosure that both the isolation structure and the method for making an isolation structure described herein are capable of applications with numerous types of MOS-processed circuits. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claim be interpreted to embrace all such modifications and changes and, accordingly the specification and drawings are to be regarded in an illustrative rather than a restrictive sense.

What is claimed is:

1. A method for forming an isolation trench comprising:
   forming a masking layer upon a semiconductor substrate, wherein a window is formed through the masking layer, and wherein the boundaries of the isolation trench are defined by the window;
   oxidizing an upper surface of the semiconductor substrate, wherein the upper surface of a region of the semiconductor substrate defined by the window is oxidized at a greater rate than regions of the semiconductor substrate covered by the masking layer; and forming the isolation trench within the portion of the semiconductor substrate defined by the window, wherein the semiconductor substrate is substantially rounded at a transition region between the isolation trench and the unetched regions of the semiconductor substrate.

2. The method of claim 1, wherein the masking layer comprises patterned silicon nitride formed upon a pad oxide layer.

3. The method of claim 2, wherein the pad oxide layer is formed by chemical vapor depositing silicon dioxide.

4. The method of claim 3, wherein the pad oxide layer is formed by thermally oxidizing the semiconductor substrate.

5. The method of claim 3, wherein forming the isolation trench comprises:

anisotropically etching through the oxidized portion of the semiconductor substrate; and anisotropically etching the underlying semiconductor substrate.

6. The method of claim 1, wherein the length of time of the oxidation process is varied to vary the degree of rounding of the semiconductor substrate at the transition regions.

7. The method of claim 1, wherein forming the isolation trench comprises anisotropically etching the semiconductor substrate, wherein the sidewalls of the formed isolation trench are substantially vertical.

8. The method of claim 1, further comprising:

forming sidewalls and a trench floor of the isolation trench by subjecting the isolation trench to an etching process; and oxidizing the sidewalls and the trench floor of the isolation trench to form a dielectric liner layer.

9. The method of claim 1, further comprising:

filling the isolation trench with a dielectric fill layer;

planarizing the dielectric fill layer such that an upper surface of the dielectric fill layer is substantially co-planar with an upper surface of the silicon nitride layer.

10. The method of claim 9, wherein said dielectric fill layer comprises CVD oxide formed from a TEOS source.

11. The method of claim 9, further comprising:

removing the masking layer; and planarizing the dielectric fill such that an upper surface of the dielectric fill layer is co-planar with an upper surface of the semiconductor substrate.

12. A method for forming an isolation trench comprising:

forming a dielectric layer upon a semiconductor substrate;

forming a masking layer upon the dielectric layer, wherein a window is formed vertically through the masking layer, and wherein the boundaries of the isolation trench are defined by the window;

oxidizing the upper surface of the semiconductor substrate, wherein the upper surface of the semiconductor substrate defined by the window is oxidized at a greater rate than portions of the semiconductor substrate covered by the masking layer; and forming the isolation trench within the portion of the semiconductor substrate defined by the window, wherein the semiconductor substrate is substantially rounded at the transition region between the isolation trench and the unetched regions of the semiconductor substrate;

filling the isolation trench with a dielectric fill layer; and planarizing the dielectric fill layer such that an upper surface of the dielectric fill layer is substantially co-planar with an upper surface of the silicon nitride layer.

13. The method of claim 12, wherein the dielectric layer is formed by chemical vapor depositing silicon dioxide.

14. The method of claim 12, wherein the dielectric layer is formed by thermally oxidizing the semiconductor substrate.

15. The method of claim 12, wherein the length of time of the oxidation process is varied to vary the degree of rounding of the semiconductor substrate at the transition regions.

16. The method of claim 12, wherein forming the isolation trench comprises anisotropically etching the semiconductor substrate, wherein the sidewalls of the formed isolation trench are substantially vertical.

17. The method of claim 12, wherein forming the isolation trench comprises:

anisotropically etching through the dielectric layer and the oxidized portion of the semiconductor substrate; and anisotropically etching the underlying semiconductor substrate.

18. The method of claim 12, further comprising:

cleaning sidewalls and a trench floor of the isolation trench by subjecting the isolation trench to an etching process; and oxidizing the sidewalls and the trench floor of the isolation trench to form a dielectric liner layer.

19. The method of claim 12, wherein the dielectric fill layer comprises CVD oxide formed from a TEOS source.

20. The method of claim 12, further comprising:

removing the masking layer; and planarizing the dielectric fill such that an upper surface of the dielectric fill layer is co-planar with an upper surface of the dielectric layer.

* * * * *